(12) United States Patent
Verbugt

(10) Patent No.: US 7,790,336 B2
(45) Date of Patent: Sep. 7, 2010

(54) METHOD OF JOINING A PLURALITY OF RETICLES FOR USE IN PRODUCING A SEMICONDUCTOR LAYOUT PATTERN, A COMPUTERIZED SYSTEM FOR IMPLEMENTING SUCH A METHOD AND A SEMICONDUCTOR MASK ARRANGEMENT PRODUCED BY IMPLEMENTING SUCH A METHOD

(75) Inventor: Daniel Wilhelmus Elisabeth Verbugt, Helden (NL)

(73) Assignee: DALSA Corporation, Waterloo (CA)

( * ) Notice: Subject to any disclaimer, the term of this patent is extended or adjusted under 35 U.S.C. 154(b) by 691 days.

(21) Appl. No.: 11/598,792

(22) Filed: Nov. 14, 2006

(65) Prior Publication Data

US 2008/0113276 A1    May 15, 2008

(51) Int. Cl.
 *G03F 1/00* (2006.01)
(52) U.S. Cl. .............................. 430/5; 430/22
(58) Field of Classification Search .......... 430/5, 430/22, 311; 716/19
See application file for complete search history.

(56) References Cited

U.S. PATENT DOCUMENTS

| | | | | |
|---|---|---|---|---|
| 5,437,946 A | * | 8/1995 | McCoy ........................ | 430/5 |
| 5,663,017 A | * | 9/1997 | Schinella et al. ........... | 430/5 |
| 6,201,598 B1 | | 3/2001 | Arai | |
| 6,204,912 B1 | * | 3/2001 | Tsuchiya et al. ............ | 355/53 |
| 6,337,162 B1 | * | 1/2002 | Irie ............................. | 430/5 |
| 6,362,491 B1 | | 3/2002 | Wang et al. | |
| 6,433,347 B1 | | 8/2002 | Suzuki | |
| 6,591,412 B2 | | 7/2003 | Nakasuji | |
| 2001/0041297 A1 | * | 11/2001 | Nishi ......................... | 430/5 |
| 2004/0036846 A1 | | 2/2004 | Nishi | |
| 2004/0070740 A1 | | 4/2004 | Irie | |
| 2005/0068467 A1 | * | 3/2005 | Bleeker et al. ............. | 349/4 |

\* cited by examiner

*Primary Examiner*—Mark F Huff
*Assistant Examiner*—Stewart A Fraser
(74) *Attorney, Agent, or Firm*—Fisher Technology Law PLLC

(57) ABSTRACT

A method for joining a plurality of reticles is used for producing a semiconductor layout pattern, so that the reticles will collectively map a circuit arrangement on a semiconductor substrate. A plurality of matching patterns is provided that are each geometrically linked to a respective particular reticle and through detecting pairwise correspondence among the matching patterns likewise correspondence among the associated reticles is ascertained.

In particular, the method has bulk sub-reticles and peripheral sub-reticles, and a first matching pattern associates to a peripheral sub-reticle that abuts a bulk sub-reticle and a second matching pattern to the bulk sub-reticle at such distance therefrom that fitting of the peripheral sub-reticle between the second matching pattern and the bulk sub-reticle allows matching of the first and second matching patterns. The bulk sub-reticles are used to constitute an array of sub-reticles.

8 Claims, 5 Drawing Sheets

METHOD OF JOINING A PLURALITY OF RETICLES FOR USE IN PRODUCING A SEMICONDUCTOR LAYOUT PATTERN, A COMPUTERIZED SYSTEM FOR IMPLEMENTING SUCH A METHOD AND A SEMICONDUCTOR MASK ARRANGEMENT PRODUCED BY IMPLEMENTING SUCH A METHOD

BACKGROUND OF THE INVENTION

The invention relates to a method for joining a plurality of reticles for use in producing a semiconductor layout pattern, so that said reticles will collectively map a circuit arrangement on a semiconductor substrate whilst providing a plurality of matching patterns that are each geometrically linked to a respective particular reticle as being furthermore recited in the preamble of Claim 1. Through ascertaining correspondence among various matching patterns the correct geometrical correspondence among the associated reticles is established. In this manner it has proven possible to produce extremely large semiconductor substrates that are used in fields such as digital storage arrays and camera pickup facilities. The art has recognized that the matching patterns are generally too big to fit in the normal array granularity, so that they will generally be positioned at an edge of "their" reticle. In practice, this will allow a maximum array size of 2×2 patterns, and in many instances, only a 1×n pattern, wherein n is an integer of 2 or more.

Hereinafter, the term reticle is used as corresponding to a "photomask", wherein a photomask comprises all functionality necessary in the ultimate semiconductor chip. It is possible to use a plurality of reticles to therefrom construct an extended chip, see FIG. 2 hereinafter. Alternatively, a reticle can be subdivided into sub-reticles, wherein various sub-reticles may project respective different functionality parts, so that the whole chip must necessarily be formed by using sub-reticles of more than one different class, see FIGS. 4 and 6 hereinafter.

As expectable, ever larger circuit areas are being requested, and the sizes of the above patterns have been found insufficient. By themselves, larger patterns can be effected, at the cost of providing non-uniform partial reticles. By way of example, an array of 2×2 patterns can be realized through using four different reticles as discussed hereinafter with reference to FIG. 2. The cost of both providing more non-uniform reticles, and also the cost of changing from one reticle to another have been found inappropriate. In consequence, the matching of the reticles should be effected on a higher level.

In consequence, amongst other things, it is an object of the present invention to allow the positioning of various reticles with respect to each other in such manner that the matching patterns are external both to the geometrical payload of the various sub-reticles and also external to the eventual circuit produced by the arrangement.

SUMMARY TO THE INVENTION

Now therefore, according to one of its aspects, the invention is characterized according to the characterizing part of claim 1. The distinguishing between the bulk sub-reticles and the peripheral sub-reticles has been recognized as a conceptual step that allows a variety of embodiments that all effect various aspects of improving the optical adjustment and matching between various sub-reticles. Moreover, the including of a peripheral sub-reticle between its associated matching pattern and a corresponding matching pattern of the bulk sub-reticle on the one hand, and the image of the bulk circuitry contained in the bulk sub-reticle on the other hand, include a quantum conceptual step. Note that bulk is not limited to meaning exclusively repetitive. The bulk could for example contain so-called wild logic.

By itself, U.S. Pat. No. 6,362,491 to Wang & Wu discloses the use of matching patterns that are relatively displaced from associated sub-reticles, but the attainable array is limited to 1×2 sub-reticles. Moreover, no such thing as displacing the bulk sub-reticle's matching pattern to the "far" side of the peripheral sub-reticle has been disclosed or suggested.

The invention also relates to a computerized system for implementing the method as claimed in claim 1, to a compound reticle, to a semiconductor mask arrangement, and to a semiconductor device manufactured by using such method, reticle, or arrangement. Further advantageous aspects of the invention are recited in dependent Claims.

BRIEF DESCRIPTION OF THE DRAWING

These and further features, aspects and advantages of the invention will be discussed more in detail hereinafter with reference to the disclosure of preferred embodiments of the invention, and in particular with reference to the appended Figures that illustrate.

DETAILED DESCRIPTION OF PREFERRED EMBODIMENTS

Figure 1:
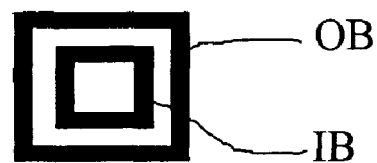
FIG. 1, a combination of two matching patterns.

FIG. 1 illustrates a combination of two matching patterns OB and IB both in the shape of a hollow square or rectangle. Each pattern forms part of its associated reticle or sub-reticle, so that verification of the correct respective positions of the two rectangles will also verify the respective positions of their respective (sub-)reticles. Typical dimensions of matching patterns now in use are 20 by 20 microns. Of course, various other shapes are feasible, such as circles or meanders. Now, advanced CMOS processes will at present go to minimum details of 0.5 micron and below, and it will often be impossible to position the matching patterns within the often repetitive pattern of the overall circuit functionality.

Figure 2:
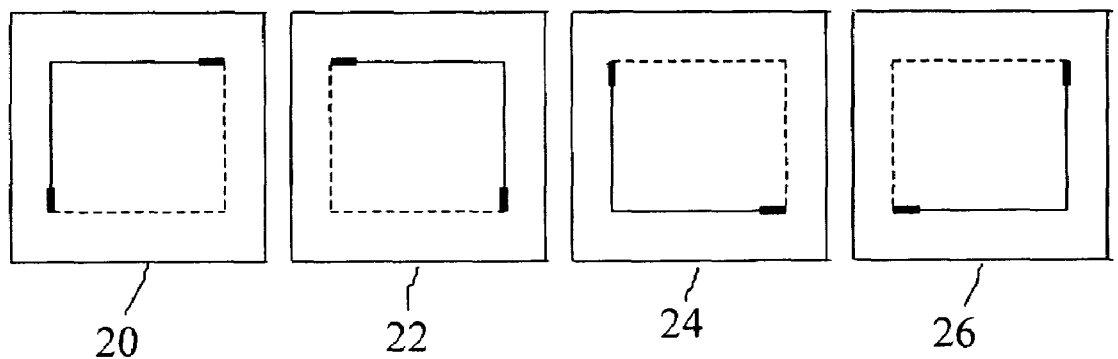
FIG. 2, a first layout possibility for two-dimensional stitching.

FIG. 2 illustrates a first layout possibility for two-dimensional stitching, that is the geometrical joining of various partial reticles into a larger compound reticle. As shown, there are four different reticles 20 through 26 that each have two matching patterns indicated by solid and bold lines. Generally, the patterns should be outside the eventual functional array. By themselves, the positioning of the patterns at the abutting edges is not a critical restriction, and they can be located in the scribing area of the semiconductor substrate. Note that a succession of various reticles may be applied on any location in view of respectively associated processing steps to be executed.

Figure 3:
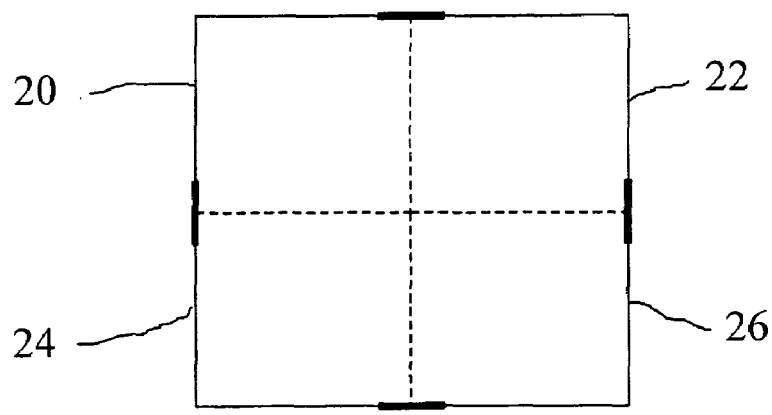
FIG. 3, a chip resulting therefrom.

FIG. 3 illustrates a chip resulting from the usage of the four patterns of FIG. 1. By way of example, the four partial reticles have been shown through lining their matching patterns up at abutting corners, as indicated by bold lines. In consequence a well lined up wafer can be produced by means of four different reticles, and four different positioning operations are necessary that are alternated by steps between positioning one of the four localizing patterns. On the one hand, this allows constructing a 2×n pattern, such as extending in the horizontal direction. By the way, this would necessitate providing six different reticles instead of four. Note that rotating the reticles for thereby producing the matching is generally impractical. On the other hand, the providing of many non-identical reticles and the associate repeated centering will let both costs and processing times explode to inappropriate values.

Figure 4:
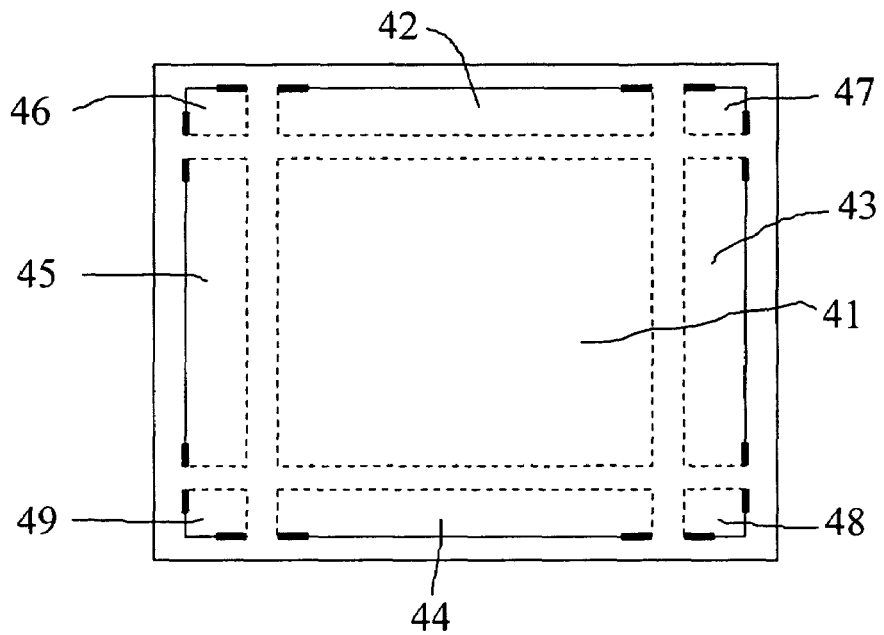
FIG. 4, a second layout possibility for two-dimensional stitching.

FIG. 4 illustrates a second layout possibility for two-dimensional stitching. Now, the main or bulk functionality of the eventual circuit is represented by central sub-reticle 41 that is present in a single version and is not provided with matching patterns. Furthermore, there is a set of peripheral sub-reticles 42 through 48 that collectively surround central reticle 41. Together, the patterns shown in FIG. 4 represent the complete functionality of the eventual circuit. Each respective sub-reticle can now be selected by shielding off the other sub-reticles so that only a single sub-reticle will be exposed in the stepper or scanner apparatus. By repeating this for every sub-reticle, the overall chip can be composed on the wafer. The gaps between adjacent sub-reticles are necessary for shielding and for adhering to the design rules of reticles for the stepper the scanner.

Regarding the content of sub-reticles 42 through 49, this can on the one hand be peripheral electrical circuitry for together with the content of central sub-reticle 41 realizing the overall functionality. On the other hand, they can contain the device sealing ring, the scribe lane, and the matching patterns for overlay monitoring. In practice, the technique described can significantly increase wafer throughput in the photolithographic or other manufacturing equipment. Furthermore, it will become feasible to produce arrays with various different sizes by using the same reticle set.

Figure 5:
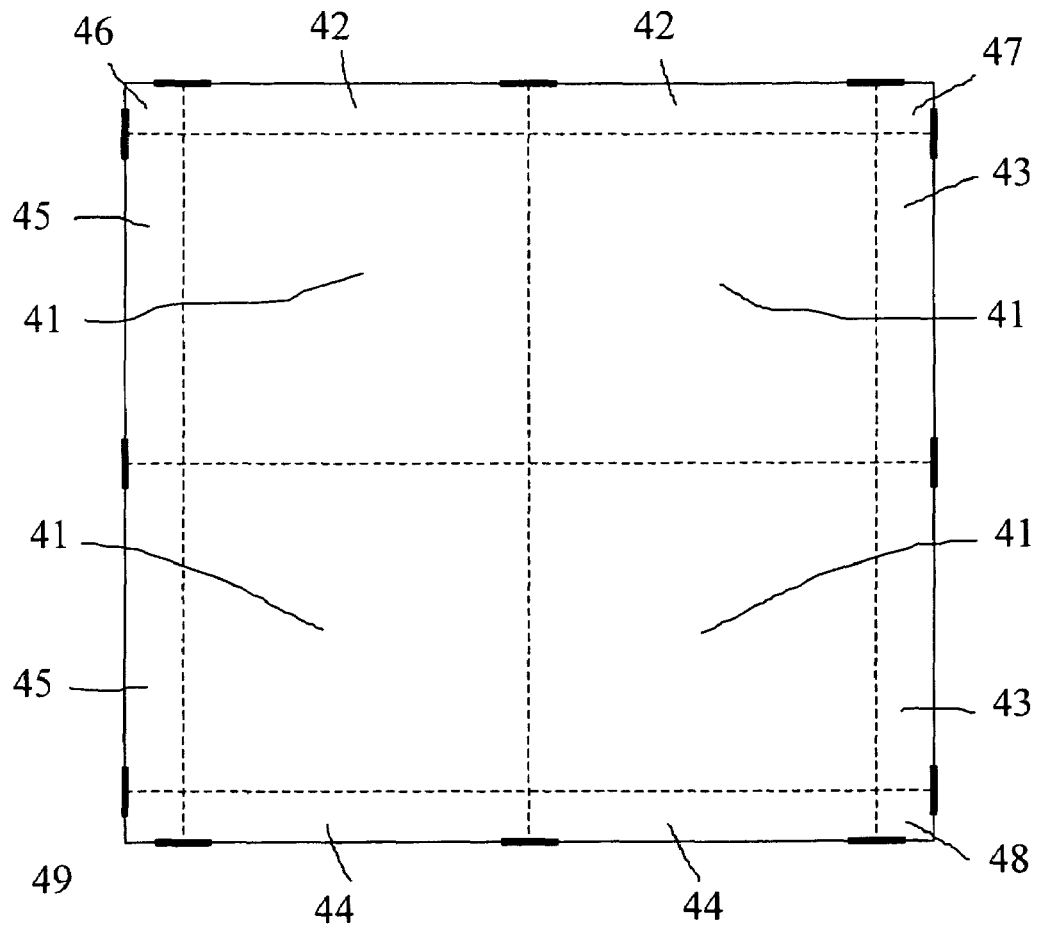
FIG. 5, a chip resulting therefrom.

FIG. 5 illustrates a chip resulting from the applying of the various (sub-)reticles of FIG. 4 for a 2×2 arrangement of central sub-reticle 41. On the one hand, the arrangement shown can be extended in both coordinate directions in an unconstrained fashion. In practice however, the overlay monitoring of the central field 41 is not possible directly, neither with respect to the peripheral sub-reticles 42 through 49, nor among various different instances of central sub-reticle 41 itself. In manufacturing environments such monitoring can however be mandatory. A solution thereto will presented with reference to FIG. 6 hereinafter. By itself, the degree of the match between various matching patterns can be quantized and the matching degrees subjected to statistical processing. In various situations this could lead to ascertaining a sufficiently or, alternatively, insufficiently lining out for the central sub-reticle. However, still better matching should be possible.

Figure 6:
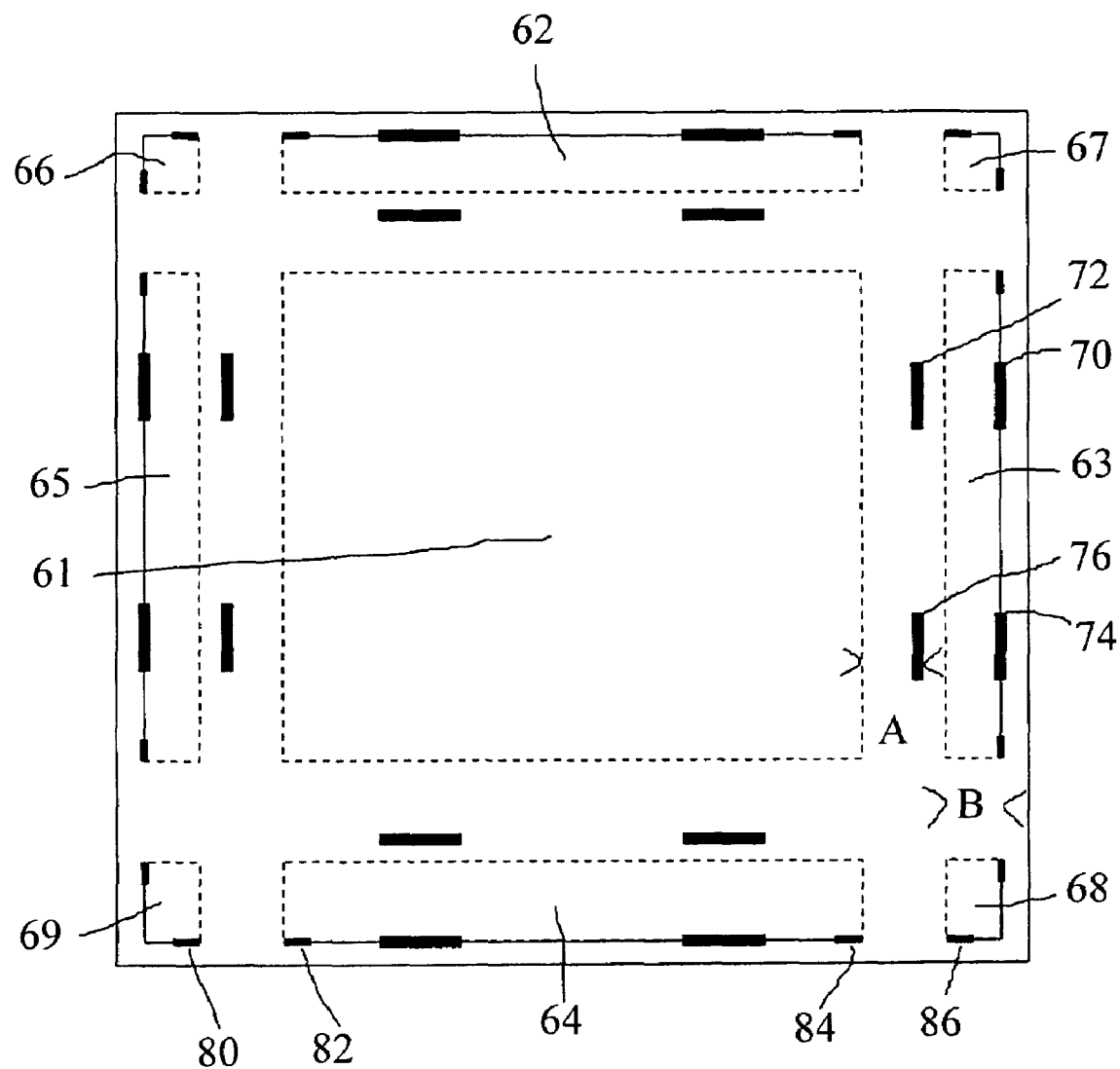
FIG. 6, a third layout possibility for two-dimensional stitching.

FIG. 6 illustrates a third layout possibility for two-dimensional stitching. Generally, the arrangement corresponds to that of FIG. 4 in that one central or bulk sub-reticle 61 has been provided that is surrounded by eight peripheral sub-reticles 62 through 69. First, the latter are provided with the same matching patterns as earlier shown in FIG. 4, such as exemplified by patterns 80, 82, 84, 86, so that line-out among those eight sub-reticles will be effected likewise. Next, central sub-reticle 61 has been shown with new matching patterns as indicated by 72, 76 on its right hand side. In practice, these two could collectively be constituted by a single matching pattern. Corresponding matching patterns have been shown on all four sides of sub-reticle 61. Sometimes, their addition can be sufficient when present on less than all four edges, such as on two or three only. Corresponding matching patterns 70 and 74 regarding patterns 72 and 76, respectively, have been added to peripheral sub-reticle 63. Now in contradistinction to earlier embodiments, matching patterns 72 and 76 are so far from central sub-reticle 61, that it is possible to expose sub-reticle 61 either with matching patterns 72, 76, or rather without the latter. Furthermore, the distance "A" between central reticle 61 and patterns 72, 76 has been dimensioned so that all of peripheral sub-reticle 63 at a width of "B" will fit therebetween, so that matching pattern pairs 70/72 and 74/76 can then be monitored for checking their correct layout. Similar procedures can be effected at the left hand side with respect to peripheral sub-reticle 65, at the top edge with respect to sub-reticle 62 and at the bottom edge with respect to sub-reticle 64.

In this manner a correct layout procedure can be effected for a strip of n×2 central sub-reticles 61, whilst allowing the strip to extend in either horizontal direction or vertical direction. If appropriate, the extra facilities need only been present at two opposing sides of central sub-reticle 61. For producing an array of n×3 central sub-reticles, the eight instances thereof that surround the central sub-reticle will be completely ascertained, and the central ninth can be subjected to the statistical processing recited with respect to FIG. 5. In this way eight sub-reticles can be positioned exactly right, whereas the ninth would in many cases be sufficiently correctly positioned as well.

Figure 7:
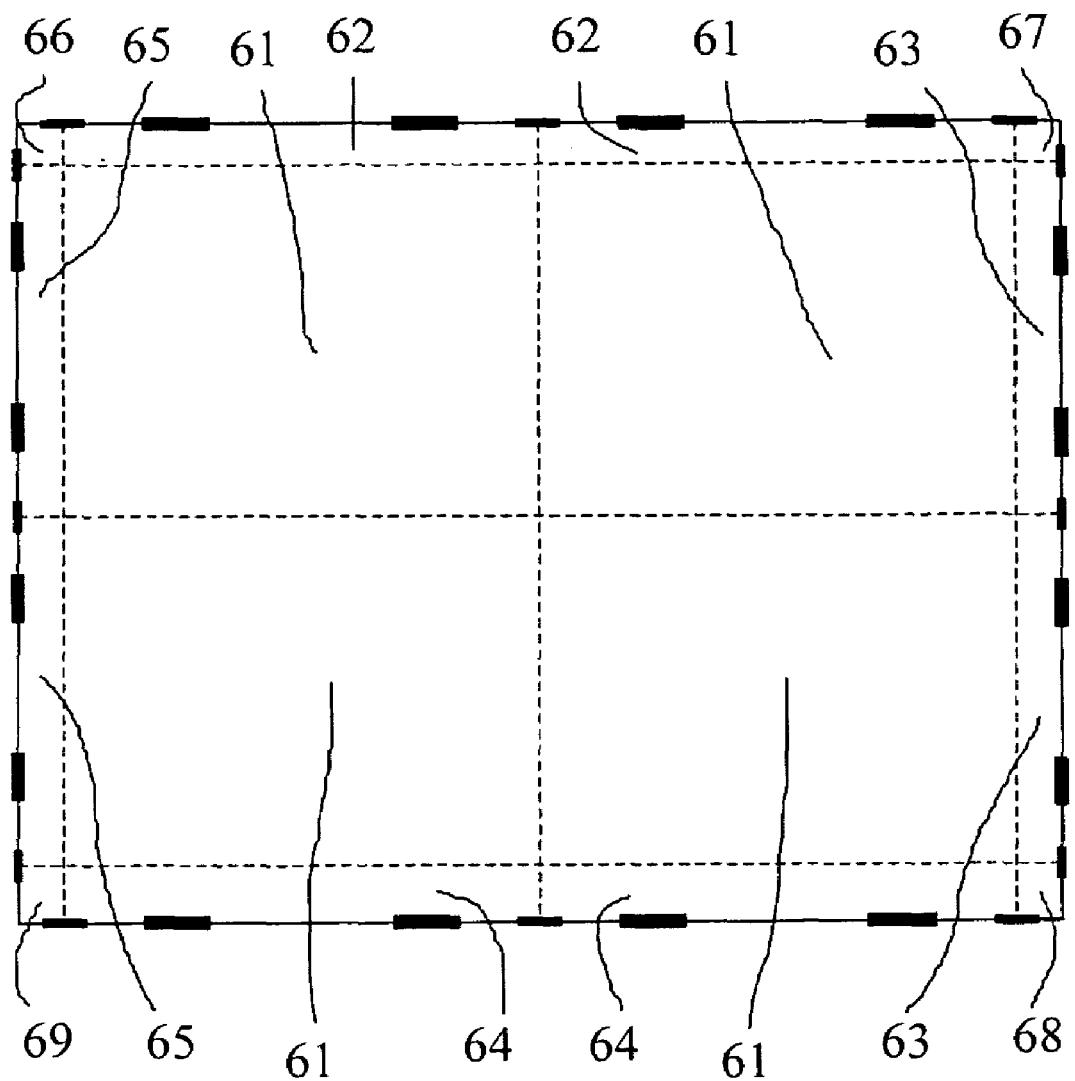
FIG. 7, a chip resulting therefrom.

FIG. 7 illustrates a 2×2 array on a chip resulting from the rub-reticle chip layout of FIG. 6. The instances of the various sub-reticles have been identified as in FIG. 6. Also, instances of the various matching patterns 80, 82, 84, 86 have been shown likewise.

Figure 8:
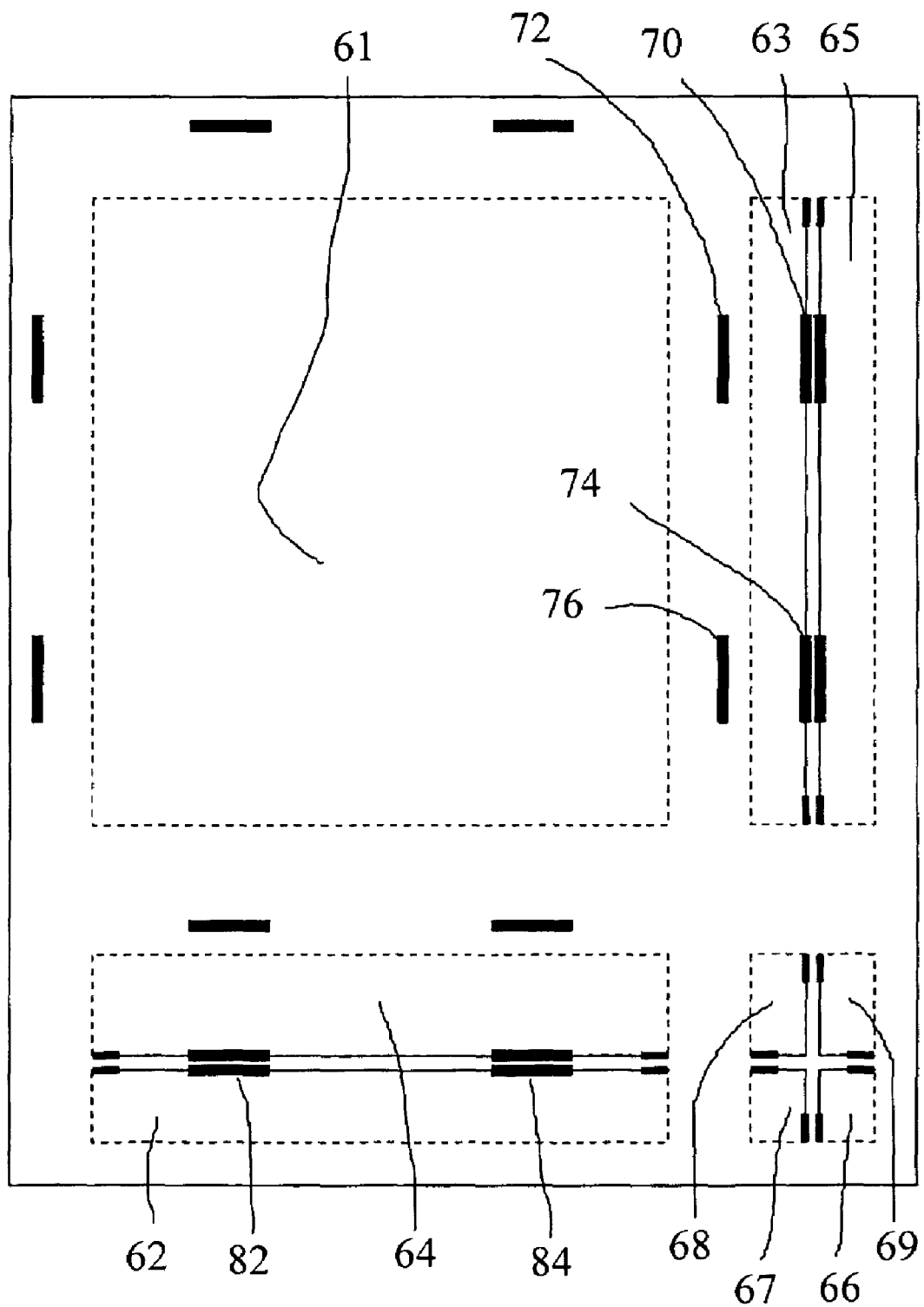
FIG. 8, an alternative to the layout of FIG. 6.

FIG. 8 illustrates an alternative to the layout of FIG. 6. The rationale is that often, a plurality of identical semiconductor chips can be placed on a single wafer. Now, for an instance where two of the arrays lie next to each other, certain peripheral sub-reticles can be projected concurrently. For example, between the rightmost projection of central sub-reticle 61, both peripheral sub-reticles 63 and 65 can be projected in abuttance to the above array, after which reticle 65 has already been projected in place for use with the next array to the right hand side. For the cluster of four peripheral sub-reticles 66 through 69, the same applies for use with four neighboring arrays. For clarity, the various matching patterns have not been numbered.

Now, all necessary elements have been shown in FIG. 8. For saving even more space, sub-reticles 63 and 65 can be positioned so close to each other in a horizontal direction in the Figure, that their respectively associated matching patterns will coincide, so that only one instance thereof is necessary. The same change can then be effected on sub-reticles 64, 62 in a vertical direction. Also, sub-reticles 66, 67, 68 and 69 will then join their matching patterns in both horizontal and vertical directions. Note that the overall size of the matching patterns of FIG. 1 is generally large compared to the minimum circuitry detail, but quite small in comparison with the overall sizes of the various (sub-)reticles.

Now, the present invention has hereabove been disclosed with reference to preferred embodiments thereof. Persons skilled in the art will recognize that numerous modifications and changes may be made thereto without exceeding the scope of the appended Claims. In consequence, the embodiments should be considered as being illustrative, and no restriction should be construed from those embodiments, other than as have been recited in the Claims.

The invention claimed is:

1. A method for joining a plurality of reticles for use in producing a semiconductor layout pattern, so that said reticles will collectively map a circuit arrangement on a semiconductor substrate whilst providing a plurality of matching patterns that are each geometrically linked to a respective particular reticle and through detecting pairwise correspondence among said matching patterns ascertaining likewise correspondence among the associated reticles, said method being characterized by having bulk sub-reticles and peripheral sub-reticles, and associating a first matching pattern to a peripheral sub-reticle that abuts a bulk sub-reticle and a second matching pattern to the bulk sub-reticle at such distance therefrom that fitting of the peripheral sub-reticle between the second matching pattern and the bulk sub-reticle allows matching of the first and second matching patterns, and wherein respective bulk sub-reticles are used to constitute an array of sub-reticles.

2. A method as claimed in claim 1, wherein said peripheral sub-reticles collectively abut at least two sides of said array.

3. A method as claimed in claim 1, wherein said peripheral sub-reticles collectively abut at least three successive sides of said array.

4. A method as claimed in claim 1, wherein said peripheral sub-reticles collectively abut all four sides of said array.

5. A method as claimed in claim 1, wherein said peripheral sub-reticles collectively abut at least two successive sides of said array whilst thereby constituting a continuous margin strip.

6. A method as claimed in claim 1 and applied in two dimensions to an array of 2×n bulk sub-reticles wherein n is an integer equal to or greater than 2.

7. A method as claimed in claim 1, wherein said peripheral sub-reticles collectively form a strip that surrounds said array.

8. A compound reticle comprising: sub-reticles; peripheral sub-reticles; and a plurality of matching patterns that are each geometrically linked to a respective sub-reticle, wherein a first matching pattern is associated with a first peripheral sub-reticle that abuts a first bulk sub-reticle at such distance therefrom that fitting of the first peripheral sub-reticle between the second matching pattern and the first bulk sub-reticle joins the first bulk sub-reticle to the first peripheral sub-reticle.

* * * * *